United States Patent [19]
Pixley et al.

[11] Patent Number: 5,754,454
[45] Date of Patent: May 19, 1998

[54] METHOD FOR DETERMINING FUNCTIONAL EQUIVALENCE BETWEEN DESIGN MODELS

[75] Inventors: Carl Pixley, Austin; Jaehong Park, College Station, both of Tex.

[73] Assignee: Motorola, Inc., Schaumburg, Ill.

[21] Appl. No.: 808,759

[22] Filed: Mar. 3, 1997

[51] Int. Cl.⁶ ................................................. G06F 17/50
[52] U.S. Cl. .................. 364/580; 364/491; 395/500; 371/22.1; 371/27.1; 371/27.4
[58] Field of Search .......................... 364/580, 488, 364/489, 490, 491; 395/500, 700; 371/22.1, 27.1, 27.4, 67.1

[56] References Cited

U.S. PATENT DOCUMENTS

| | | | |
|---|---|---|---|
| 5,331,568 | 7/1994 | Pixley | 364/489 |
| 5,572,535 | 11/1996 | Pixley et al. | 371/22.1 |
| 5,649,165 | 7/1997 | Jain et al. | 395/501 |

OTHER PUBLICATIONS

Masahiro Fujita, et al., "Evaluation and Improvements of Boolean Comparison Method Based on Binary Decision Diagrams", 1988 IEEE, CH2657–5/88, 4 pgs.

Yusuke Matsunaga, "An Efficient Equivalence Checker for Combinational Circuits", 33rd Design Automation Conf., ACM 0-8979-1-779-0/96/0006, pp. 629–634.

C. Leonard Berman, et al., "Functional Comparison of Logic Designs for VLSI Circuits", 1989 IEEE, CH2805-0/89/0000/0456, pp. 456-459.

*Primary Examiner*—James P. Trammell
*Assistant Examiner*—Kamini S. Shah
*Attorney, Agent, or Firm*—J. Gustav Larson

[57] ABSTRACT

The present invention determines whether two design files have identical functionality by attempting to create a binary decision diagram (BDD) for corresponding verification output pairs(302). When the BDD creations are not successful for all evaluated output pairs a set of cutpoint pair candidates are identified(303). An automatic test program generator (ATPG) is used to determine whether or not the cutpoint pair candidates are invalid cutpoints(304). The invalid cutpoints are removed from the set of cutpoint pair candidates(305). A cutpoint pair candidate having known support is selected (306). An exclusive-or of the outputs of the selected candidate is formed (307). A BDD for the resulting XOR function is attempted (308). If a BDD having a zero or one value is built then the selected candidate is valid indicating equivalence (310). If the BDD is neither the zero function nor the one function, the cutpoint pair is invalid if all of its inputs are verification inputs (311). If one or more of the inputs are cutpoint variable inputs, the function for a cutpoint variable input is substituted (309), and the flow continues to build a new BDD for the evaluation XOR having the substituted function.

27 Claims, 9 Drawing Sheets

METHOD FOR DETERMINING FUNCTIONAL EQUIVALENCE BETWEEN DESIGN MODELS

FIELD OF THE INVENTION

The present invention relates generally to semiconductor device verification, and specifically to verifying identical functionality between separate semiconductor design models.

BACKGROUND OF THE INVENTION

Finding design flaws in the early stages of VLSI manufacturing process is crucial to avoid expensive penalties in terms of time to market and profit. Recent dramatic increases in semiconductor device size and complexity make verifying design correctness of VLSI circuits very difficult. Until recently, most design verification approaches have been simulation-based verifications. However, increasing device complexity has made simulation-based verifications impractical for some cases.

Formal design verification is the use of mathematical techniques to attempt to achieve 100% of accuracy and coverage, and has recently received attention as an alternative to simulation for some applications. But the circuit size to which formal verification approaches can be applied is often limited. One problem with formal design verification is logic checking. During the VLSI chip design process, logic checking is used to verify blocks of combinational logic in different design models that are believed to be identical. However, the use of formal approaches for logic checking has a worst case complexity that is NP-hard, making verification inherently difficult for large circuits.

Many approaches have been proposed for logic checking. They can be divided into functional methods based on Boolean representations, such as Binary Decision Diagrams (BDDs), and structural methods such as ATPG.

Functional methods using BDD are based upon a graphical representation for Boolean functions. BDDs have several desirable characteristics including: (1) Most commonly encountered functions can be represented in a reasonable size of space. (2) It is a canonical form, in that every Boolean function has its own unique representation. (3) Boolean operations of two functions can be efficiently performed. Thus, BDDs have been used for many CAD applications where Boolean functions are used.

Once BDDs are built for Boolean functions of two designs, then the logic checking problem is reduced to comparing two BDDs, which is trivial. However, some designs are impractical for building BDDs because they require excessive amounts of memory space because of their functional characteristics.

Also the use of structural, or analytical methods such as ATPG, also is limited in that the heuristics do not always work well for logic checking between two very large industrial circuits, one of which is highly optimized compared to the other.

Therefor a method for verifying identity between large design models in a resource efficient manner is desirable.

BRIEF DESCRIPTION OF THE DRAWINGS

The present invention is illustrated by way of example and not limited in the accompanying figures, in which like references indicate similar elements, and in which.

DETAILED DESCRIPTION OF THE DRAWINGS

Logic checking of very large designs is inherently difficult problem. Its worst case complexity increases exponentially with respect to the number of inputs. However, the present invention identifies a practical method of comparing two designs with structural similarity, which enables logic checking of large commercial designs.

The present invention determines whether two design files have identical functionality by attempting to create a binary decision diagram (BDD) for corresponding verification output pairs. When the BDD creations are not successful for all evaluating output pairs a set of cutpoint pair candidates are identified. An automatic test program generator (ATPG) is used to determine whether or not the cutpoint pair candidates are invalid cutpoints. The invalid cutpoints are removed from the set of cutpoint pair candidates. A cutpoint pair candidate having known support is selected. Known support, or known input, is defined to mean all inputs to a cutpoint pair are a combination of verification inputs, primary inputs, and cutpoint variables. An exclusive-or of the outputs of the selected candidate is formed. A BDD for the resulting XOR function is attempted. If a BDD having a zero or one value is built then the selected candidate is valid indicating equivalence or inversion. If the BDD is neither the zero function nor the one function, the cutpoint pair is invalid providing all of its inputs are verification inputs. If one or more of the inputs are cutpoint variable inputs, the function for a cutpoint variable input is substituted, and the flow continues to build a new BDD for the evaluation XOR having the substituted function.

Figure 1:
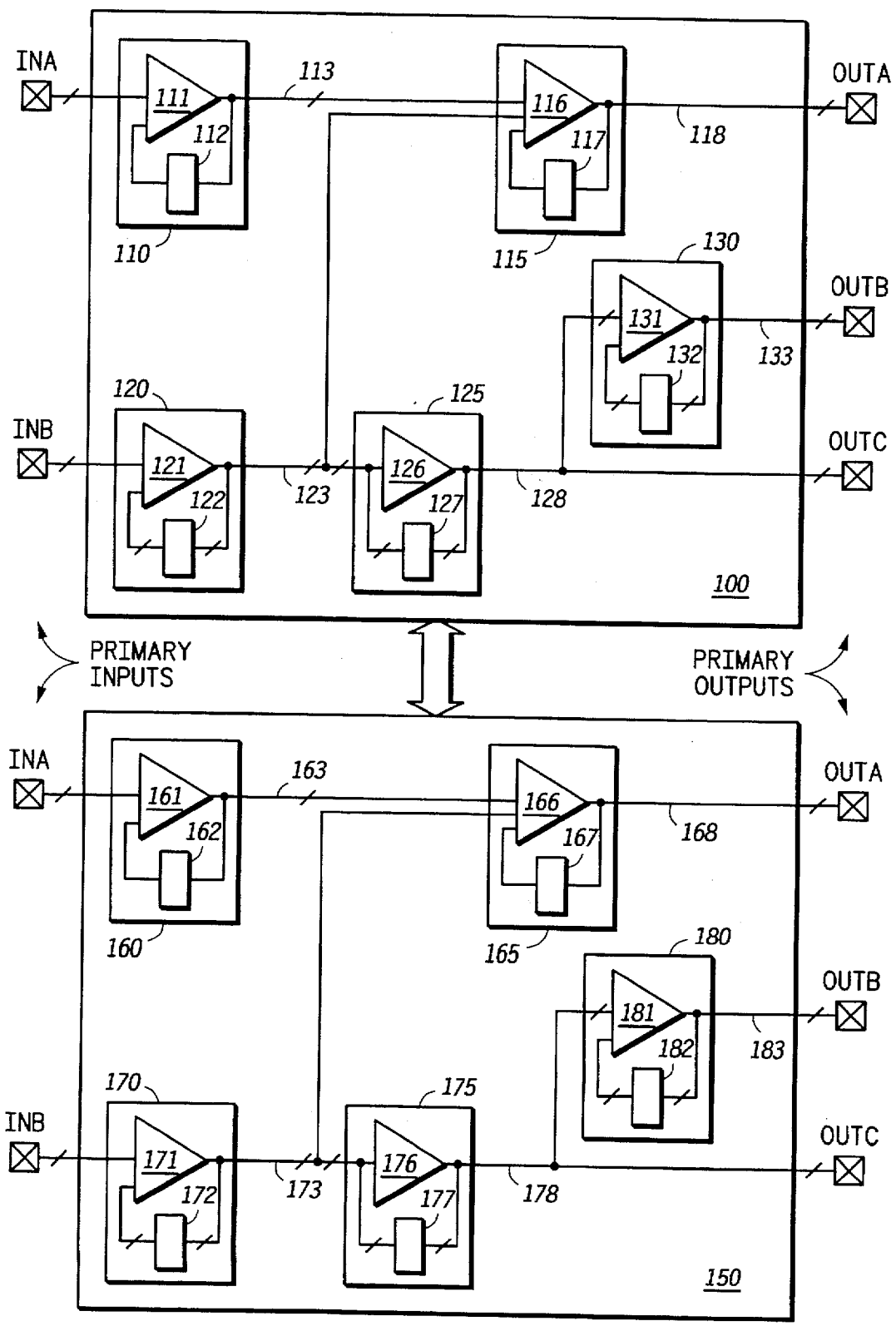
FIG. 1 illustrates, in block and logic diagram form, a logic representation of two design files.

The present invention is best understood by way of example as illustrated in FIGS. 1 through 11. FIG. 1 illustrates a design model 100 being compared to a design model 150. Model 100 comprises a logic diagram which could have been derived from a register transfer logic (RTL) model or from a gate level model. As such the circuit portions 110, 115, 120, 125, and 130 are refered to as subblocks of the model. Each of circuit portions 110, 115, 120, 125, and 130 contain a latch 111, 116, 121, 126, 131, and a cone of logic 112, 117, 122, 127, and 132 respectively. The input to a latch or a primary output of the model is referred to as a verification output. While the output of a latch or a primary input is referred to as a verification input. The value of a verification output is controlled by its associated cone of logic. The associated cone of logic includes all logic coupled to the verification output without an intervening latches. For example, referring to circuit portion 115 of FIG. 1, the cone of logic coupled to verification node 118 includes cone 116, cone 111, and cone 121. The associated cone of logic can receive verification inputs, and cutpoint variables as discussed in more detail later.

Figure 2:
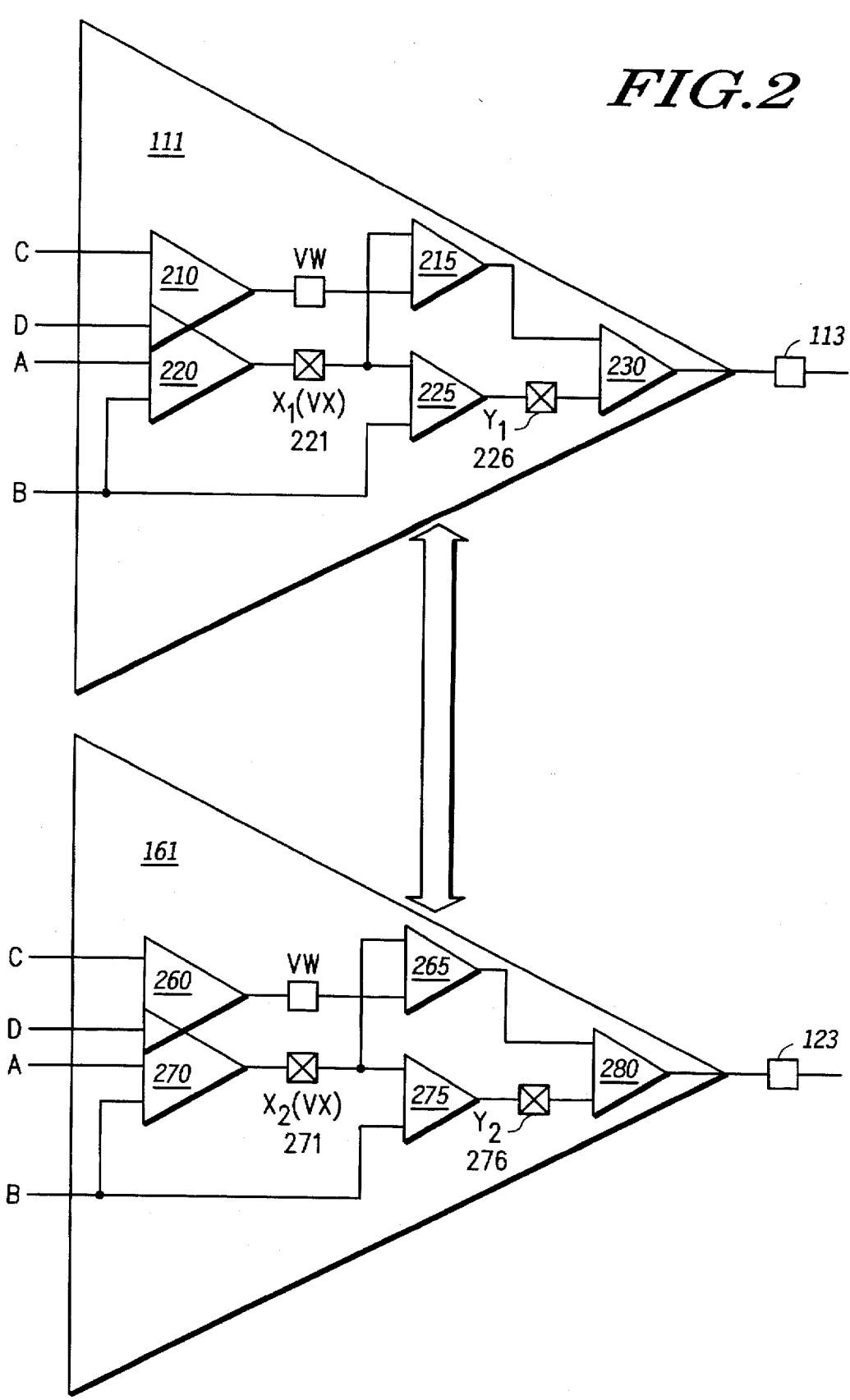
FIG. 2 illustrates, in block diagram form, a portion of FIG. 1 known as a cone of logic.

An input labeled INA is connected to an input of the circuit portion 110. The verification output of Circuit portion 110, namely net 113, is connected to an input of Circuit portion 116. The verification output 118 of Circuit portion 116 is connected to output node labeled OUTA. An input labeled INB is connected to an input of Circuit portion 120. The verification output 123 of Circuit portion 120 is connected to an input of Circuit portion 125, and Circuit portion 115. The verification output 128 of Circuit portion 125 is connected to an input of Circuit portion 130, and to an output node labeled OUTC. The verification output 133 of Circuit portion 130 is connected to and output labeled OUTB. The inputs INA, INB, and the outputs OUTA, OUTB, and OUTC may be individual input signals or represent multiple inputs. For example, the inputs A, B, C, and D of FIG. 2 are INA of FIG. 1. The design 150 has similar connectivity as design 100 with corresponding locations incremented by 50 exists for design 150.

FIG. 2 illustrates a more detailed view of the corresponding cones of logic 111 and 161. The cone of logic 111 is part of the Circuit portion 110 of design 100, and the cone of logic 161 is part of the Circuit portion 160 of design 150. Cone of logic 111 comprises smaller cones of logic 210, 215, 220, 225, and 230. The point of each cone of logic represents a cutpoint candidate location in our example. Cone of logic 161 comprises smaller cones of logic 260, 265, 270, 275, and 280. The point of each cone of logic represents a cutpoint candidate location in our example. Both cones of logic 111, 161 receive inputs labeled A, B, C, and D. The input A is connected to cones of logic 220 and 270. The input B is connected to the cones of logic 220, 225, 270, and 275. The input C is connected to cones of logic 210 and 260. The input D is connected to cones of logic 210, 220, 260, and 270. The output of cone of logic 210 forms a cutpoint candidate in our example labeled VW and is connected to cone of logic 215. The output of cone of logic 220 forms cutpoint candidate X1 221 and is connected to cone of logic 215 and 225. The output of cone of logic 215 forms an unlabeled cutpoint candidate and is connected to cone of logic 230. The output of cone of logic 225 forms cutpoint Y1 226, and is connected to cone of logic 230. The output of cone of logic 230 is connected to the output node 113. The output of cone of logic 260 forms a cutpoint labeled VW and is connected to cone of logic 265. The output of cone of logic 270 forms cutpoint X2 271 and is connected to cone of logic 265 and 275. the output of cone of logic 265 forms an unlabeled cutpoint and is connected to cone of logic 280. The output of cone of logic 275 forms cutpoint Y2 276, and is connected to cone of logic 280. The output of cone of logic 280 is connected to the output node 163. The output node 118 and 168 form a corresponding output pair.

Figure 3:
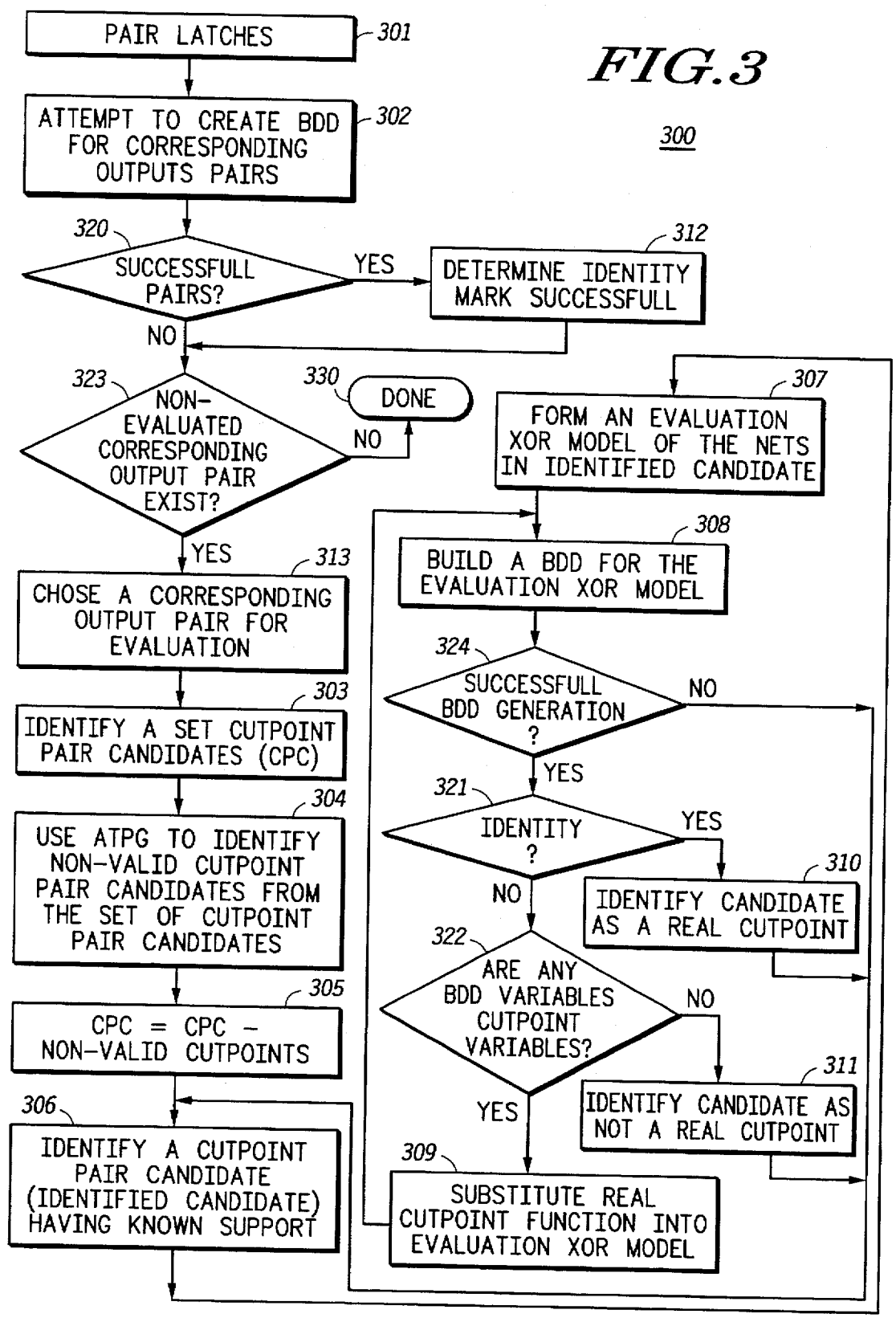
FIG. 3 illustrates, in flow diagram form, a method in accordance with the present invention.

The method 300 of FIG. 3 comprises rectangular shaped operations steps 301 through 313, diamond shaped evaluation steps 320 through 324, and an oval termination step 330.

Figure 4:
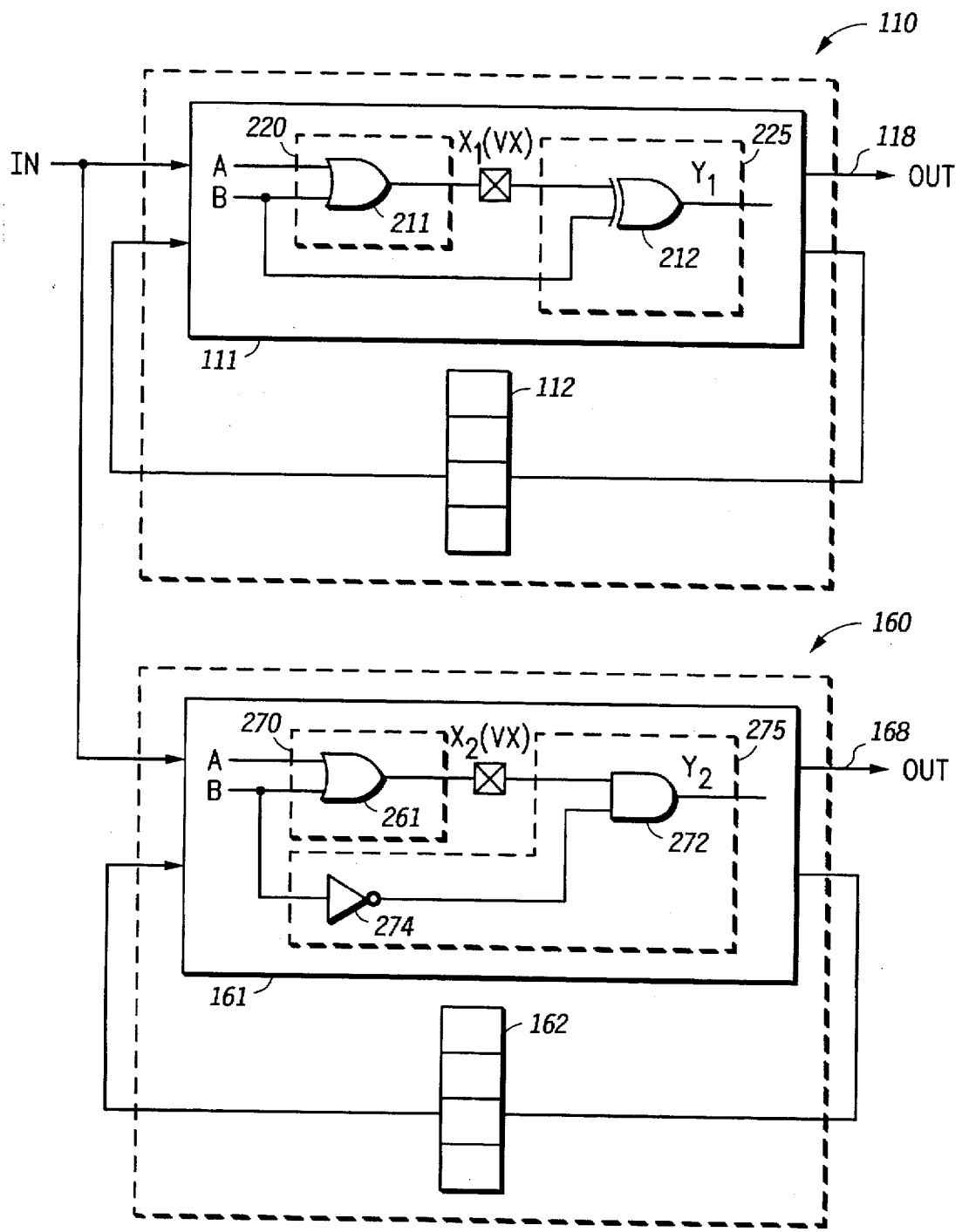
FIG. 4 illustrates, in block and logic diagram form, a portion of the two models of FIG. 1.

FIG. 4 illustrates an expanded view of Circuit portions 110 and 160 of FIG. 1. In FIG. 4, cone of logic 220 comprises a two input or- gate 211. Cone of logic 270 comprises a two input or gate 261. Cone of logic 225 comprises a two input exclusive-or gate 261. Cone of logic 275 comprises an inverter 224 connected to an and-gate 272.

Referring to FIG. 1, a first model 100 is being compared to a second model 150. The models 100 and 150 represent related designs that should be functionally identical. The models 100 and 150 are shown to contain circuit portions 110, 115, 120, 125, 130, 160, 165, 170, 175, and 180. Different functional models may be used for model 100 and model 150 with the present invention. Circuit portions are illustrated in FIG. 1 for example purposes only.

Within each Circuit portion, there is a cone of logic which represents a combinational logic portion of the Circuit portion. For purposes of the present invention, the combinational logic is prohibited from providing feedback within the cone of logic. This implies that there is no loop of logic in the circuit that in unbroken my a latch. As illustrated in FIG. 2, it is illustrated that a cone of logic 111 and 161 from FIG. 1 may be further divided into smaller cones of logic. FIG. 3, which illustrates a detailed portion of FIG. 2, will be discussed further below.

Method 300 of FIG. 3 illustrates one embodiment of the present invention. At step 301, latches between the first and a second design model 100 and 150 are paired. Referring to FIG. 1, latch 112 of design 100 is paired to latch 162 of design 150. Latch 117 is paired to latch 167. Latch 122 is paired to latch 172. Latch 127 is paired to latch 177. Latch 1132 is paired to latch 182. These pairings identify nodes forming verification output pairs (Nodes 113 and 163, 118 and 168, 123 and 173, 128 and 178, 132 and 182 are corresponding verification output pairs). The cones of logic illustrated in FIG. 1 as part of the circuit portions drive the verification output pairs.

The pairing of the latches in step 301 can be done either automatically or by user input. One method of automatically pairing latches is described in U.S. Pat. No. 5,638,381 (08/505,431) by Cho. (Note, the Issue Fee has been submitted, however the application has not yet issued.) By definition, once the registers are paired, their corresponding cones of logic can be identified. By determining identity for each verification output pair, identity between the designs 100 and 150 can be determined.

Next, at step 302, an attempt is made to create a BDD for those corresponding verification output pairs meeting a predefined threshold. On such threshold is based upon the number of levels of logic driving each output pair. As previously discussed, as Boolean function representations become larger, it requires exponentially more resources in terms of memory and/or execution time. A threshold of approximately ten levels of logic or less has been determined to be an efficient threshold. A threshold of ten limits the BDD creation of step 302 to only those corresponding outputs whose function is derived by ten levels of logic or less. For example, in FIG. 1, cone of logic 111, could have a threshold of logic less than ten while cone of logic 12 does not.

Next, at step 320, the pairs having BDDs generated successfully are acted upon by step 312 which then determine whether they match and mark them as verified. The flow continues to step 323 from step 312 and step 320 where it is determined whether there are any corresponding verification output pairs that have not been resolved, where resolved indicates that the pair has been shown definitely to be equivalent or not be equivalent. The corresponding verification output pairs not meeting the threshold of step 302, and those not having a BDD generated successfully in step 320, are passed into step 323 from step 320 and step 312.

At step 313, a determination is made whether any corresponding verification output pairs remain to be evaluated. If not, the method 300 is done. Otherwise, the flow proceeds to step 313. At step 313, a corresponding verification output pair is chosen arbitrarily for evaluation. Next, at step 303, cutpoint pair candidates (CPC) are identified using a random simulation. The cutpoint pair candidates exist within the cones of logic associated with each of the corresponding verification output pairs. Cutpoint pair candidates are nodes believed to be identical in the two designs. Referring to FIG. 2, the cutpoint pairs for cones of logic 111 and 161 are VW and VW, X1 and X2, and Y1 and Y2. Note that the nodes labeled VW in FIG. 2 represent a cutpoint candidate pair that has been determined valid, as opposed to the variables X1 and X2 which comprise a cutpoint candidate pair which has not yet been validated.

One method of identifying cutpoint pair candidates is to supply a parallel random pattern simulation to cones 111 and 161. Note, this may be done to the entire design 100 and 150 at one time. Based on the random simulation, the vertices with identical signatures are grouped together. The resulting identity groups are called simulation signature groups. We apply a large number of patterns so that simulating more patterns would not be of much help to distinguish additional non-related vertices. Note that random simulation is not strong enough to distinguish all non-related vertex pairs. Note also that the term identical signatures also anticipates signatures that are inversions of each other. For purposes of example, the cutpoint pairs X1 and X2 and Y1 and Y2 of FIG. 2 are illustrated in more detail in FIG. 4. Where design module information is available, it is beneficial to choose cutpoint candidates for further analysis which are on boundaries of sub-modules. Following step 303, the method 300 continues at step 304.

At step 304, a structure based verification tool such as an automatic test program generator (ATPG) is used to screen out invalid cutpoint pairs. This is accomplished by submitting each cutpoint pair candidate to an ATPG tool which attempts to force different output values on the cutpoint pair candidate from common set of common input values. This is an improvement over the prior art in that ATPG programs have not been used to quickly eliminate bad cutpoint pair candidates. One embodiment of the present invention limits the resources that the ATPG program can dedicate to determining validity of any given candidate. The limitation will generally be based upon time or memory allocation. This is especially beneficial over the prior art, in that for large circuits ATPG programs can take very long periods of time. Therefore the present invention is advantageous over the prior art in that in limits the amount of time spent trying to resolve specific portions of logic with a specific method.

Next, at step 305, the cutpoint pair candidates deemed invalid are removed from the set of cutpoint candidates. Next, at step 306, a cutpoint pair candidate is identified (the identified candidate) that has known support. The term known support refers to the fact that all inputs to the identified candidate (or cone of logic) are verification inputs or cutpoint variables. Generally, the candidate selected first will be the candidate closest to the verification inputs. Once the cutpoint pair candidate has been identified at step 306, the flow proceeds to step 307.

At step 307, an exclusive-or (XOR) model of the selected candidate is formed. The XOR model is formed by connecting an exclusive-or gate between the nodes forming the cutpoint pair candidate. If there is identity between the cutpoint pair, the XOR model will always be zero, indicating an exact match, or one, indicating an inverted match.

Next, at step 308, a BDD is generated for the XOR model. The BDD generation of step 308 can be terminated if it takes up to many resources as discussed previously with reference to ATPG generation. When this occurs the status of the attempted generation will be stored as part of the determination of step 324, and flow will proceed back to step 306. If BDD generation does succeed at step 308, the method 300 continues to step 321. At step 321 a determination is made whether or not the BDD indicates an identity match. It should be noted that identity is indicated when the BDD is equal to zero or one, indicating identical node results, or opposite node results respectively. Where identity is not determined, a subsequent determination is made at step 322 as to whether or the variable inputs are cutpoint variables. If none of the variables are cutpoint variables, flow proceeds to step 311 where the candidate is removed from the set of candidates because it is not a valid cutpoint. If there remains a cutpoint variable, flow proceeds to step 309, where the functional model for a cutpoint variable is substituted into the XOR model.

In the event that there are more than one cutpoint variables driving the candidate pair, a determination needs to be made as to which cutpoint variable to substitute. By maintaining a history at steps 310, 312, and 324, it is known which variable have had positive and negative effects in the past. In one embodiment of the present invention, a variable that was previously substituted, and as a result caused a cutpoint to be successfully identity as valid at step 321 is used first. A variable that has caused BDD generation to fail at step 324, is avoided as long as possible. Where multiple variable inputs have the same weighting, the one nearest a verification input or primary input. The use of this criteria is an improvement over the prior art in that verification of the cutpoint pair is converges more quickly than with the prior art.

From steps 310 and 311, flow proceeds back to step 306 where another cutpoint pair candidate is identified. The flow discussed above will continue, and will converge until the corresponding output pairs 118 and 168 are compared. At this point identity for the corresponding verification output is established and flow continues at step 323 to process another corresponding verification output. Once all corresponding verification outputs are processed, design integrity is established.

FIGS. 4 through 9 provide an example of the method 300. FIG. 4 illustrates cutpoint pairs X1 and X2 and Y1 and Y2, and their associated cones of logic. In reality, cones of logic of one and two gates would generally be avoided but will be used herein for the purpose of example. The fact that cutpoint pairs have been identified implies that we have completed step 303 of the method 300. Proceeding to step 304, an ATPG program is run on the pairs to determine whether any of the cutpoints can be eliminated. By way of example, it is assumed no elimination results. Next, at step 305, both pairs are included in the set of cutpoint candidates to be analyzed. At step 306, the pair X1 and X2 would be identified as having known support, since its inputs are either primary inputs or verification inputs from latches as illustrated in FIG. 1.

Proceeding to step 307 an evaluation XOR model (not shown) is formed. The BDD for this model would be built at step 308, and at step 321 the BDD would be zero indicating identity. (This result is intuitive in that both cones 220 and 270 consist of a single or-gate.) At step 310, the nodes X1 and X2 would be replace with the variable (VX) indicating that it is now a valid cutpoint. In addition, the function of X, for inputs A and B is stored.

Figure 8:
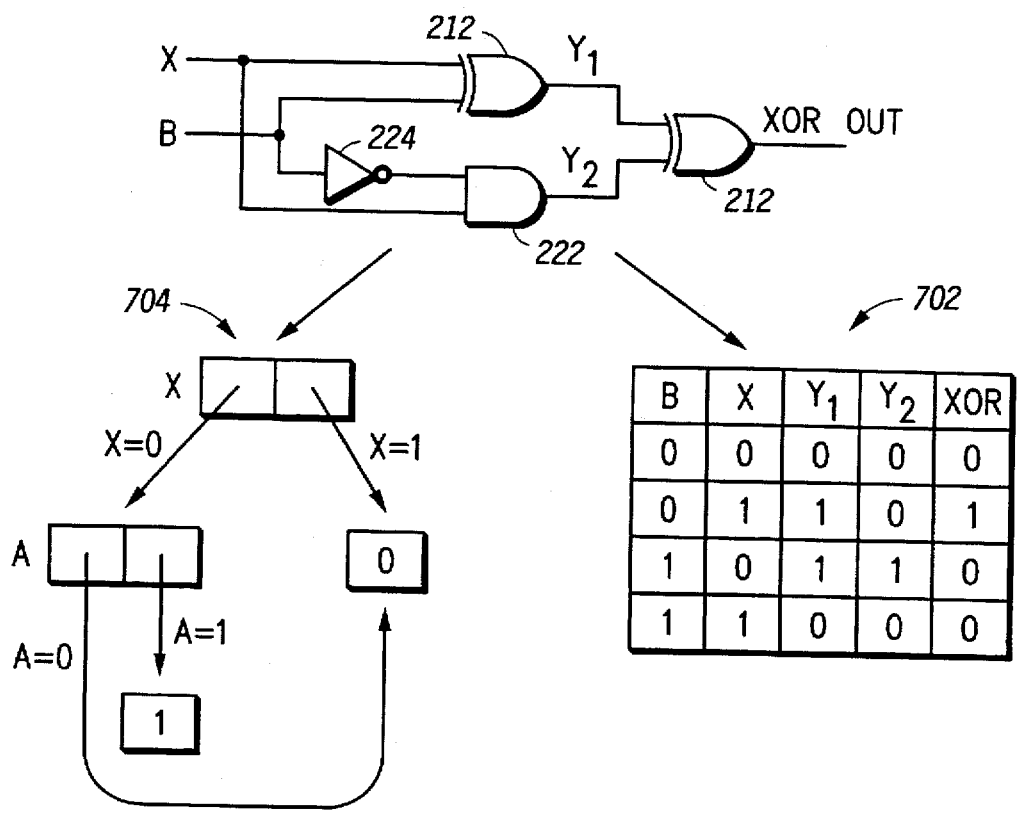
FIG. 8 illustrates, in logic and flow form, a binary decision diagram (BDD) and truth table for a logic portion of FIG. 1.

The method 300 now proceeds to step 306, where the candidate pair Y1 and Y2 is analyzed. At step 307, the XOR model is created, as indicated in FIG. 8, the XOR model is the function of cone 225 and cone 275 XORed together. At step 308, a BDD is built for the XOR model. For illustration purposes, the BDDs for cone of logic 225 and for cone of logic 275 are illustrated separately.

Figure 6:
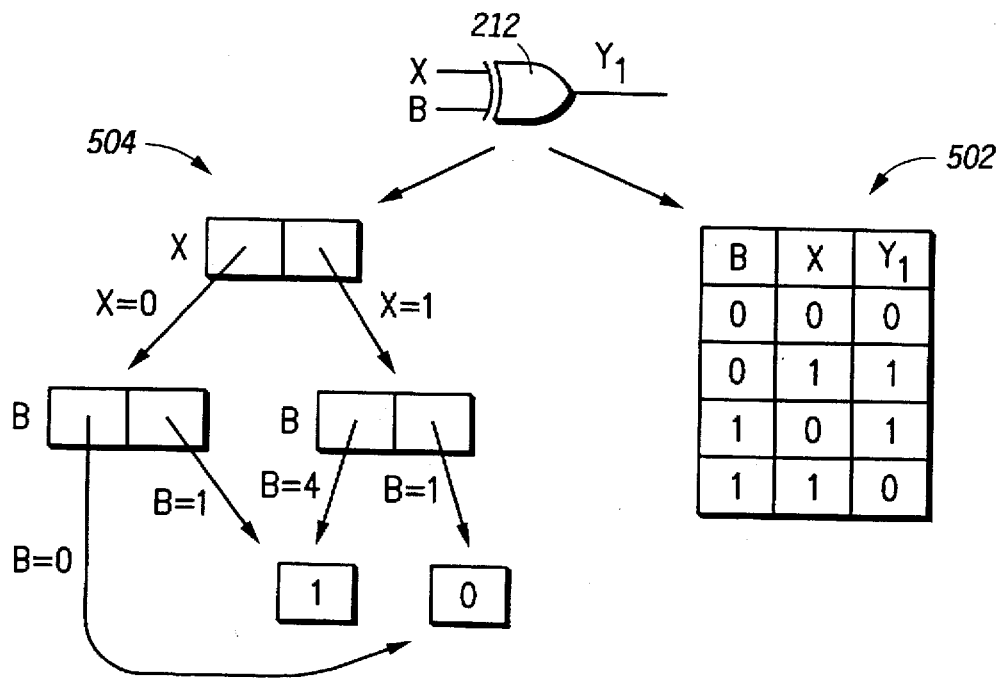
FIG. 6 illustrates, in logic and flow form, a binary decision diagram (BDD) and truth table for a logic portion of FIG. 1.
Figure 7:
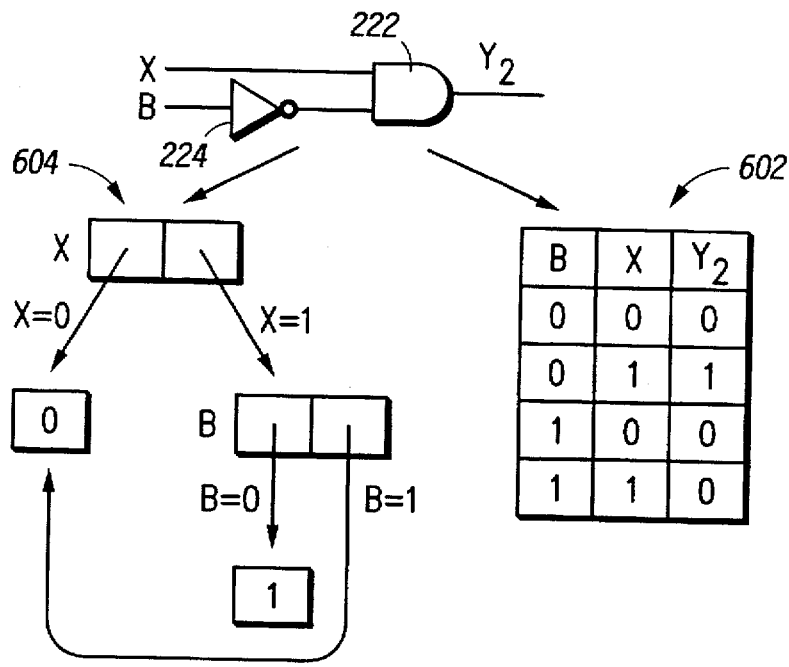
FIG. 7 illustrates, in logic and flow form, a binary decision diagram (BDD) and truth table for a logic portion of FIG. 1.

Referring to FIG. 6, the cone of logic 225 is illustrated along with its truth table 502 and BDD 504. Note that the inputs to the cutpoint pair represented by cones 225 cones 225 and 275 are the cutpoint variable X and the primary input B, and its output is Y1. Therefor the truth table 502 and BDD 504 use these nodes to describe the function of the gate 212. In FIG. 7, the cone 275 is illustrated along with its truth table 602 and BDD 604.

Figure 5:
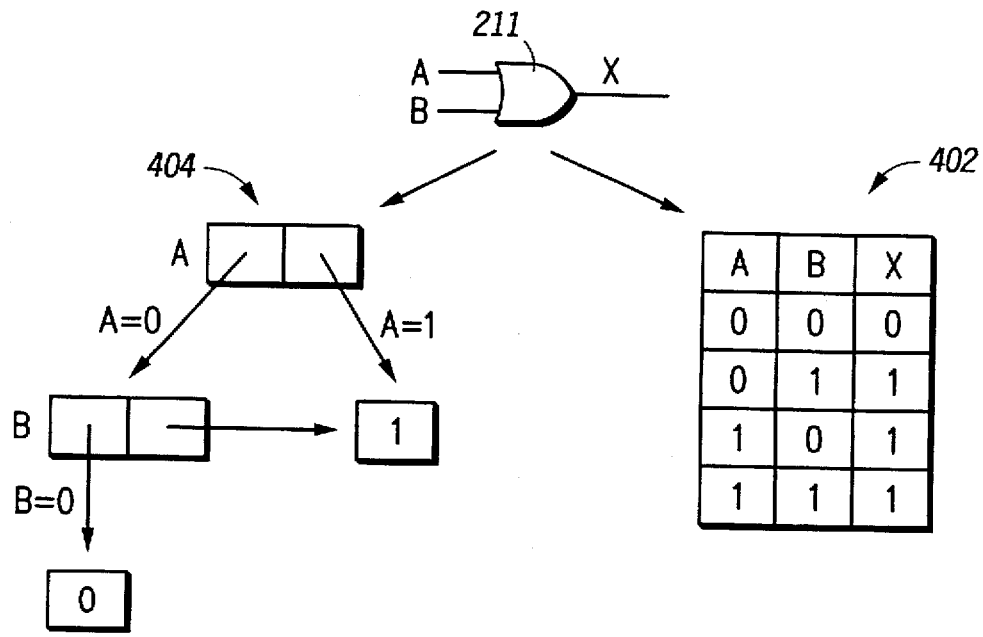
FIG. 5 illustrates, in logic and flow form, a binary decision diagram (BDD) and truth table for a logic portion of FIG. 1.

FIG. 8 illustrates the XOR model connected to the nodes Y1 and Y2. Referring to the BDD 804, it can be seen that the BDD has both a zero value and a one value. Therefore, at step 321, no identity will be determined and flow will proceed to step 322. At step 322, a determination will be made that one of the variables (X) is a cutpoint variable, and flow will proceed to step 309. At step 309, the function for X in FIG. 5 is substituted into the equation for the XOR model of FIG. 8. This is illustrated in FIG. 9, where the BDD 504 for X is substituted for the node X in the BDD 704 for the XOR model of FIG. 8.

Figure 9:
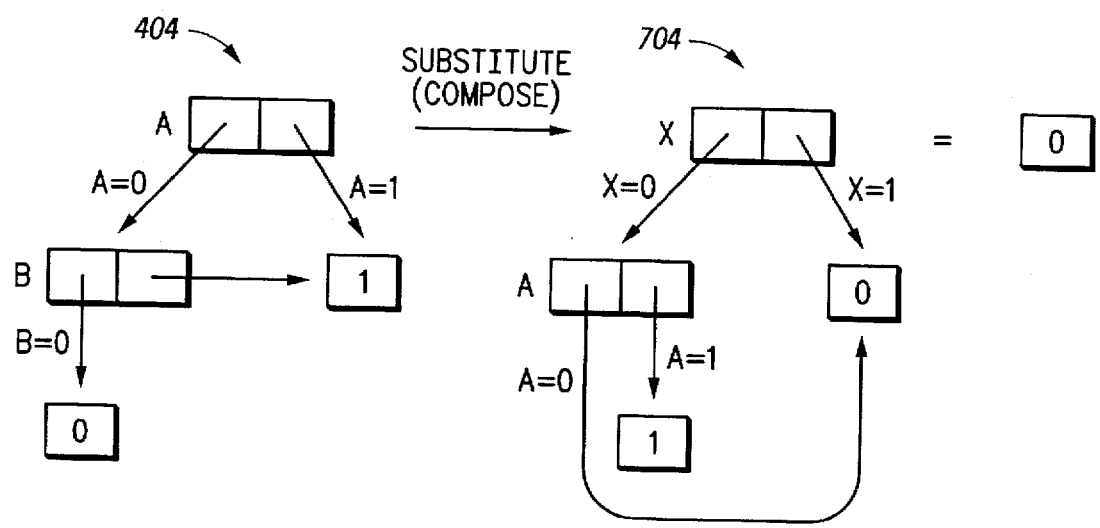
FIG. 9 illustrates, in flow form, the results of substituting one BDD into a second BDD.

As FIG. 9 illustrates, the results when the BDD of function X is composed, substituted, into the BDD of the XOR model. The result is an identity of zero, indicating that for all possible input values, Y1 and Y2 will match. Therefore, a false negative was detected during the first pass of step 321. During this pass, step 321 detects an valid cutpoint and flow will proceed to step 310 where nodes Y1 and Y2 will be identified as a match, and a common variable VY will replace Y1 and Y2, and the function of VY will be stored.

Figure 10:
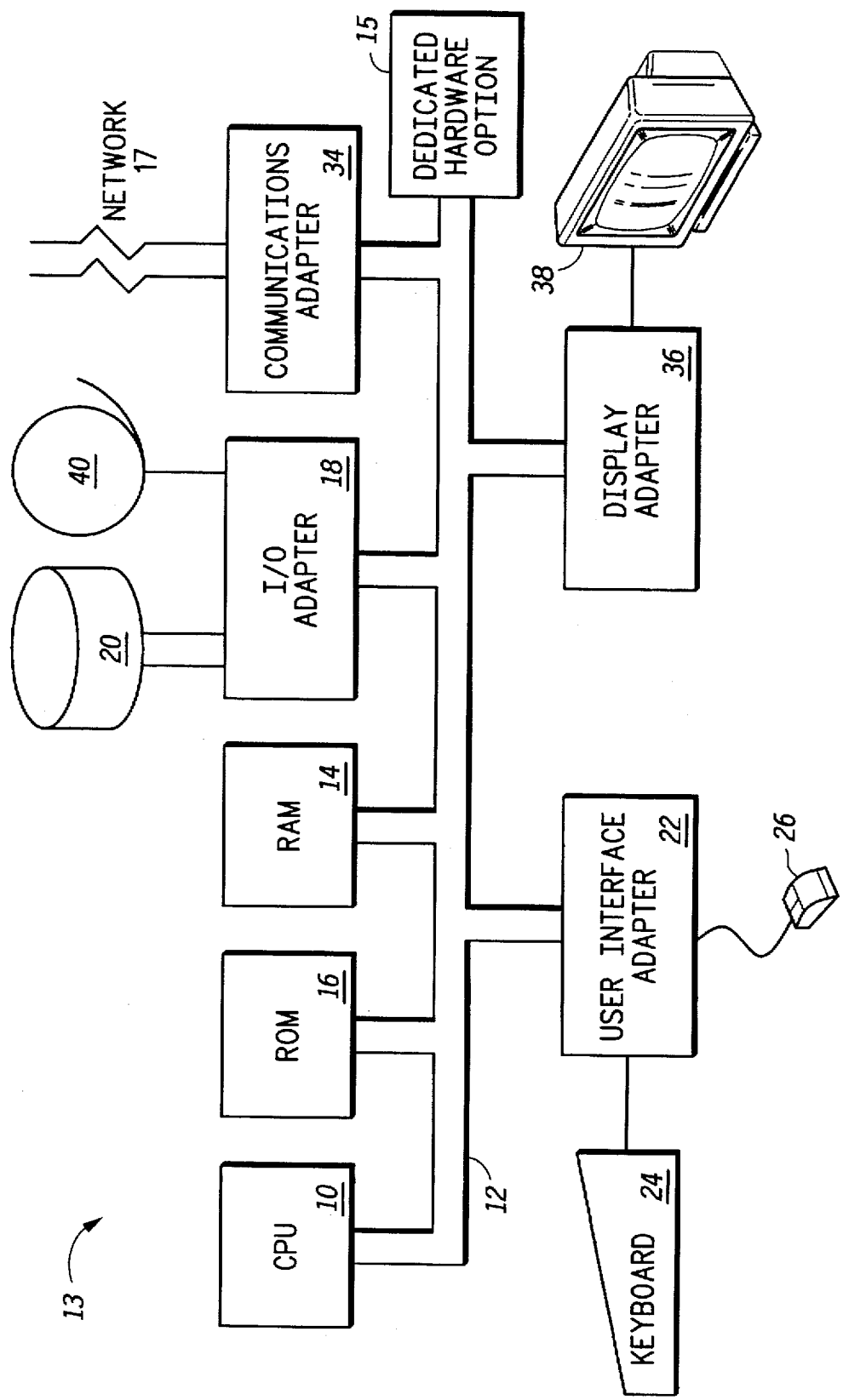
FIG. 10 illustrates, a block diagram for computer system in accordance with present system.

The various methods discussed above may be implemented within dedicated hardware 15 as illustrated in FIG. 10 or within processes implemented within a data processing system 13. A typical hardware configuration of a workstation which may be implemented to accomplish the methodologies disclosed herein, is illustrated and includes a central processing unit (CPU) 10, such as a conventional microprocessor, and a number of other units interconnected via a system bus 12. The workstation shown in FIG. 1 includes random access memory (RAM) 14, read only memory (ROM) 16, and input/output (I/O) adapter 18 for connecting peripheral devices, such as disk units 20 and tape units 40, to bus 12. A user interface adapter 22 is used to connect a keyboard device 24 and a mouse 26 to the system bus 12. Other user interface devices such as a touch screen device (not shown) may also be coupled to the system bus 12 through the user interface adapter 22.

A communication adapter 34 is also shown for connecting the workstation to a data processing network 17. Further, a display adapter 36 connects the system bus 12 to a display device 38. The method of the present invention may be implemented and stored in one or more of the disk units 20, tape drives 40, ROM 16 and/or RAM 14, or even made available to system 13 via a network connection through communications adapter 34 and thereafter processed by CPU 10. Since the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 11:
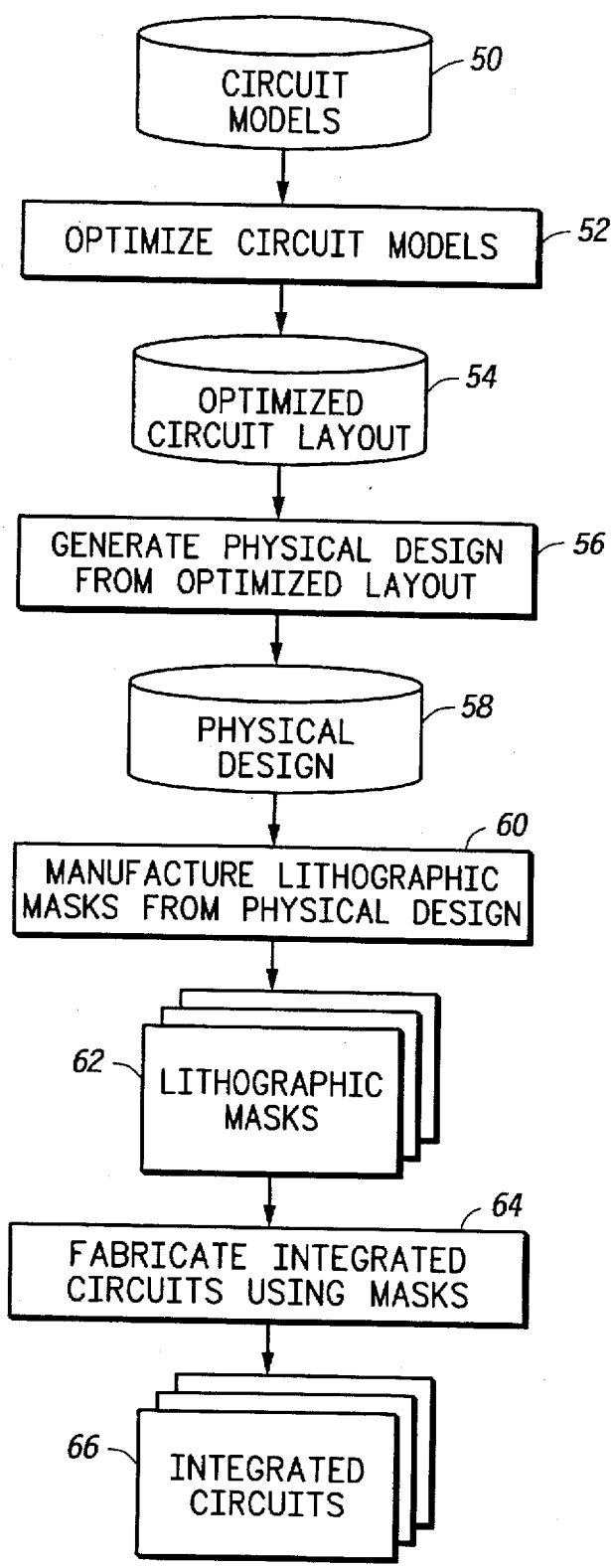
FIG. 11 illustrates, a flow diagram in accordance with present invention.

FIG. 11 is a block diagram that illustrates integrated circuit fabrication utilizing the optimized circuit resulting from the method 300 of FIG. 3. The optimization tool 52 utilizes circuit models 50 to generate an optimized circuit layout 54. A physical design file 58 is generated 56 from the optimized circuit layout 54. The circuit models 50, optimized circuit layout 54, and physical design 58 are typically stored as data files on computer readable media such as disk units 20. The physical design file 58 includes integrated circuit dimensions, element dimensions, and element locations within the integrated circuit. The physical design file 58 locates elements and connections within a two-dimensional substrate area of an integrated circuit die. Preferably, the physical design file 58 includes physical structure for performing the functions of an integrated circuit design from which the physical design file 58 was derived. The physical design 58 is converted 60 into a set of lithographic masks 62 corresponding to the layers in the physical design file 58. The lithographic masks 62 are used to fabricate 64 integrated circuits 66.

The methods taught herein are used to generate CAD (computer aided design) data files which contain information regarding an integrated circuit and placement of gates, transistors, and the like in the integrated circuit. Specifically, the present invention could be used within step 52 to verify optimizations to a circuit layout or design model. These files are then used to form lithographic masks which are then used to form a plurality of integrated circuits on a plurality of wafers using an integrated circuit fabrication facility. The design phase is taught in "*Principles of CMOS VLSI Design: A Systems Perspective*", by N. H. E. Weste and K. Eshragian in the VLSI Series by Addison-Wesley, 1985. Fabrication techniques are outlined in "*Silicon Processing for the VLSI Era, Volume 1: Process Technology*", by Wolf and Tauber, copyright 1986, published by Lattice Press. Process integration is taught by the second book in the series: "*Silicon Processing for the VLSI Era, Volume 2: Process Integration*", by Wolf, copyright 1990, published by Lattice Press.

The methods and implementing apparatus of the present invention has been described in connection with the preferred embodiments as disclosed herein. Although exemplary embodiments of the present invention have been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A method of determining identity between two circuits comprising:

identifying a first cutpoint pair candidate using random simulations, wherein the first cutpoint pair candidate comprises a first node from a first design model and a second node from a second design model; and using an automatic test program generator (ATPG) to determine whether a common set of inputs is capable of producing a first result on the first node and a second result on a second node, where the second result is logically different than the first result such that an exclusive-or of the first and second is true.

2. The method of claim 1, wherein the step of identifying further includes identifying the first cutpoint pair candidate over a second cutpoint pair candidate, when the first cutpoint pair candidate resides on a module boundary.

3. The method of claim 1, further comprising the step of: determining if the first cutpoint pair candidate is a first real cutpoint pair, wherein the first cutpoint pair candidate is a valid cutpoint pair when the first node and the second node are logically identical function.

4. The method of claim 3, further comprising the step of: instantiating a variable input for the first real cutpoint pair.

5. The method of claim 3, further comprising the step of: storing the logically identical function of the first real cutpoint pair.

6. The method of claim 3, further comprising the step of: substituting a function for a cutpoint variable input if the first cutpoint pair candidate is not determined to be a first real cutpoint pair, wherein the cutpoint variable input represents a node previously identified as a valid cutpoint pair.

7. The method of claim 6, wherein the step of substituting further comprises choosing a first input variable over a second input variable, where the first input variable was previously substituted into a second cutpoint pair candidate, and as a result, the second cutpoint pair candidate was determined to be a second real cutpoint.

8. The method of claim 6, wherein the step of substituting further comprises choosing a first input variable over a second input variable, where the second input variable was previously substituted into a second cutpoint pair candidate, and as a result, a functional description of the first cutpoint pair candidate could not be determined within predetermined resource criteria.

9. The method of claim 6, wherein the step of substituting further comprises choosing a first input variable over a second input variable, where the first input variable has a smaller functional description than the second input variable.

10. A method of logic comparison comprising the steps of:
identifying a first set of corresponding verification output pairs in a first design file and a second design file;
determining a second set of corresponding verification output pairs, wherein each corresponding element of the second set of corresponding verification output pairs meets a predefined threshold;
attempting to generate functional descriptions for an each member of the second set of corresponding verification output pairs;
defining a third set of corresponding verification output pairs to include any member of the second set of corresponding verification output pairs for which the step of attempting to generate failed;
identifying a set of cutpoint pair candidates for at least one member of third set; and
performing a structural analysis on at least one cutpoint pair candidate of the third set of cutpoint pair candidates, wherein the structural analysis will eliminate the at least one cutpoint pair candidate from the third set of cutpoint pair candidates if the cutpoint pair candidate is capable of different output values.

11. The method of claim 10 wherein the step of determining a second set of corresponding output pairs further comprises the predefined threshold indicating a maximum number of logic levels, wherein only corresponding output pairs driven by fewer than the maximum number of logic levels would meet the predefined threshold.

12. The method of claim 11, wherein the step of performing a structural analysis includes the structural analysis being an automated test program generator.

13. The method of claim 12, wherein an exclusive-or function is formed between each node of the at least one cutpoint pair candidate.

14. The method of claim 12, wherein the step of performing a functional analysis includes performing a binary decision diagram (BDD) analysis of remaining cutpoint pair candidates in the third set of cutpoint pair candidates, wherein remaining cutpoints are those in the set of cutpoint pair candidates not eliminated by the ATPG.

15. The method of claim 11, wherein the step of identifying a set of cutpoint pair candidates further includes identifying the first cutpoint pair candidate over a second cutpoint pair candidate, when the first cutpoint pair candidate resides on a module boundary.

16. A method of logic comparison comprising the steps of:
specifying a binary decision diagram (BDD) creation criteria, wherein if a BDD is created within the BDD creation criteria a BDD creation was successful, and if a BDD is not created within the BDD creation criteria the BDD creation was unsuccessful;
attempting to create a BDD representation of a corresponding output pair using the BDD creation criteria;
identifying a cutpoint pair candidate associated with the corresponding output pair if the BDD creation for the corresponding output pair is unsuccessful;
submitting the cutpoint pair candidate to an automatic test program generator (ATPG) for analysis, wherein the ATPG can determine the cutpoint pair candidate is an invalid candidate;
forming an exclusive-or model of the cutpoint pair candidate, wherein the exclusive-or model includes an exclusive-or-ing the cutpoint pair candidates together; and
attempting to create a BDD representation for the exclusive-or model when the ATPG does not determine the cutpoint pair candidate to be an invalid candidate.

17. The method of claim 16 further comprising the step of determining if the exclusive-or model indicates an identity between the cutpoint pair candidates when generation of the BDD for the exclusive-or model is successful, wherein the identity indicates the cutpoint pair candidate is a real cutpoint.

18. The method of claim 17 further comprising the step of:
replacing the cutpoint pair candidate with a variable input representation when the cutpoint pair candidate is determined to be a real cutpoint.

19. The method of claim 17 further comprising the step of:
storing a function of the cutpoint pair candidate when the cutpoint pair candidate is determined to be a real cutpoint pair.

20. The method of claim 17 further comprising the step of:
substituting a function for a variable input when the BDD for a cutpoint pair candidate is successfully generated, but does not indicate an identity between the cutpoint pair candidates.

21. The method of claim 20, wherein the step of substituting further comprises choosing a first variable input as the variable input over a second variable input, where the first variable input variable was previously substituted into a second cutpoint pair candidate, and as a result, the second cutpoint pair candidate was determined to be a second real cutpoint.

22. The method of claim 20, wherein the step of substituting further comprises choosing a first variable input as the variable input over a second variable input, where the second variable input variable was previously substituted into a second cutpoint pair candidate, and as a result, a functional description of the cutpoint pair candidate could not be determined within predetermined resource criteria.

23. The method of claim 17 further comprising the step of:
identifying the cutpoint pair candidate as invalid when the BDD is successfully generated for the cutpoint pair candidate and the BDD receives only known inputs.

24. The method of claim 16, wherein the step of identifying a cutpoint pair candidate further includes identifying a first cutpoint pair candidate over a second cutpoint pair candidate, when the first cutpoint pair candidate resides on a module boundary.

25. A data processing system for verifying design model integrity, the data processing system comprising:
a central processor unit for executing instructions; and
a memory coupled to the central processor unit for containing data processor instructions for execution by the central processor unit, the data processor instructions comprising:
identifying a first cutpoint pair candidate, wherein the first cutpoint pair candidate comprises a first node from a first design model and a second node from a second design model; and
using an automatic test program generator (ATPG) to determine whether a common set of inputs is capable of producing a first result on the first node and a second result on a second node, where the second result is logically different than the first result.

26. A method of manufacturing a semiconductor device comprising the steps of:
receiving a first design file for the semiconductor device;
receiving a second design file for the semiconductor device;
identifying a first cutpoint pair candidate, wherein the first cutpoint pair candidate comprises a first node from a first design model and a second node from a second design model;
validating the first design file to the second design file by using automatic test program generator (ATPG) to determine whether a common set of inputs is capable of producing a first result on the first node and a second result on a second node, where the second result is logically different than the first result wherein the first design file is validated if the ATPG is unable to produce logically different results; and
manufacturing the semiconductor device based on the first design file if the first design file is validated.

27. A computer readable medium (storage medium) for storing a design verification routine comprising the steps of:
identifying a first cutpoint pair candidate using random simulations, wherein the first cutpoint pair candidate comprises a first node from a first design model and a second node from a second design model; and
using an automatic test program generator (ATPG) to determine whether a common set of inputs is capable of producing a first result on the first node and a second result on a second node, where the second result is logically different than the first result such that an exclusive-or of the first and second node is true.

* * * * *